(12) United States Patent
Li

(10) Patent No.: US 12,381,100 B2
(45) Date of Patent: Aug. 5, 2025

(54) CARRIER PLATE AND TRANSFERRING DEVICE

(71) Applicant: BOE Technology Group Co., Ltd., Beijing (CN)

(72) Inventor: Haixu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/760,982

(22) PCT Filed: May 17, 2021

(86) PCT No.: PCT/CN2021/094195
§ 371 (c)(1),
(2) Date: Mar. 16, 2022

(87) PCT Pub. No.: WO2022/241626
PCT Pub. Date: Nov. 24, 2022

(65) Prior Publication Data
US 2024/0047250 A1 Feb. 8, 2024

(51) Int. Cl.
*H01L 21/673* (2006.01)
*H10H 20/80* (2025.01)

(52) U.S. Cl.
CPC ....... *H01L 21/67336* (2013.01); *H10H 20/80* (2025.01)

(58) Field of Classification Search
CPC ........... H01L 21/67336; H01L 21/6835; H01L 25/0783; H01L 21/167; H01L 33/00; H01L 33/0095; B29C 65/00; B29C 65/48; B29C 65/4855; B29C 65/76; B29C 66/00; B29C 66/004; B29C 66/41; B29C 66/70; B29C 66/72; B29C 66/73; B29C 66/731; B29C 66/7316; B29C 66/73161; B29C 66/73162

(Continued)

(56) References Cited

U.S. PATENT DOCUMENTS

| 4,941,255 A * | 7/1990 | Bull | H01L 23/544 |
| | | | 257/E21.705 |
| 2013/0285086 A1* | 10/2013 | Hu | H01L 24/83 |
| | | | 438/34 |

(Continued)

FOREIGN PATENT DOCUMENTS

| CN | 107331644 A | 11/2017 |
| CN | 112289908 A | 1/2021 |
| CN | 112310252 A | 2/2021 |

*Primary Examiner* — Philip C Tucker
*Assistant Examiner* — Brian R Slawski
(74) *Attorney, Agent, or Firm* — IPro, PLLC

(57) ABSTRACT

The embodiments of the present application provide a carrier plate and a transferring device. The carrier plate particularly includes a transporting base plate, a dissociation regulating feature and a dissociable-adhesive layer that are sequentially arranged, the dissociation regulating feature is configured to regulate a dissociation accuracy of the dissociable-adhesive layer, and the dissociable-adhesive layer is configured to be connected to a plurality of light-emitting-diode chips. The carrier plate can increase the yield and the dissociation accuracy of the light-emitting-diode chips, which can increase the yield in the process of the mass transfer and the efficiency of the mass transfer of the light-emitting-diode chips.

10 Claims, 8 Drawing Sheets

(58) Field of Classification Search
USPC ... 156/60, 155, 247, 272.2, 272.8, 289, 297,
156/299, 701, 702, 711, 712;
257/E21.532, E21.705; 438/455, 458
See application file for complete search history.

(56) References Cited

U.S. PATENT DOCUMENTS

2020/0013662 A1* 1/2020 Chaji ................. H01L 21/6835
2021/0029830 A1* 1/2021 Maltabes ................ H05K 3/20

* cited by examiner

CARRIER PLATE AND TRANSFERRING DEVICE

TECHNICAL FIELD

The present application relates to the technical field of displaying, and particularly relates to a carrier plate and a transferring device.

BACKGROUND

With the development of the technique of displaying, the light-emitting-diode displaying technique, as a novel displaying technique, has gradually become one of the research hotspots. The light-emitting-diode displaying technique utilizes an array formed by light emitting diodes (LED) to display. As compared with other displaying techniques, the light-emitting-diode displaying technique has the advantages of a higher luminous intensity, a higher response speed, a lower power consumption, a lower voltage demand, lighter equipment, a longer service life, a higher impact resistance, and a better anti-interference performance, and so on. Moreover, micro-sized light emitting diodes (Micro-LED) having a smaller size can better achieve a high-resolution of the products, for example, smartphones or virtual display screens of a 4K or even a 8K resolution.

In the production process of a light-emitting-diode base plate, a carrier plate is usually required to be used to realize the mass transfer of the light-emitting-diode chips. After the dissociable-adhesive layer in the carrier plate is excited, and before the dissociable-adhesive layer is entirely dissociated, gas is firstly generated inside the dissociable-adhesive layer to form a microcavity, which very easily causes position deviation of the light-emitting-diode chips in the process of falling, it seriously reduces the yield of the transfer of the light-emitting-diode chips, and it also reduces the dissociation accuracy of the light-emitting-diode chips.

SUMMARY

In the first aspect, an embodiment of the present disclosure discloses a carrier plate, wherein the carrier plate comprises: a transporting base plate, a dissociation regulating feature and a dissociable-adhesive layer that are sequentially arranged, the dissociation regulating feature is configured to regulate a dissociation accuracy of the dissociable-adhesive layer, and the dissociable-adhesive layer is configured to be connected to a plurality of light-emitting-diode chips.

Optionally, the dissociation regulating feature comprises a plurality of regulating micro-features, and each of the regulating micro-features corresponds to one of the light-emitting-diode chips;

an orthographic projection of the regulating micro-feature on the transporting base plate is a first projection, and an orthographic projection of the light-emitting-diode chip on the transporting base plate is a second projection; and the first projection of each of the regulating micro-features and the second projection of the light-emitting-diode chip corresponding thereto at least partially overlap, and an area of the first projection is less than or equal to an area of the second projection.

Optionally, the regulating micro-feature comprises: an arc-shaped protrusion provided on one side of the dissociable-adhesive layer that is closer to the transporting base plate.

Optionally, the transporting base plate is provided with a first arc-shaped slot at a position facing the arc-shaped protrusion, a shape of the first arc-shaped slot and a shape of the arc-shaped protrusion match, and the arc-shaped protrusion is embedded in the first arc-shaped slot.

Optionally, the carrier plate further comprises: a medium layer, the medium layer is provided between the transporting base plate and the dissociable-adhesive layer, the medium layer is provided with a second arc-shaped slot at a position facing the arc-shaped protrusion, a shape of the second arc-shaped slot and a shape of the arc-shaped protrusion match, and the arc-shaped protrusion is embedded in the second arc-shaped slot.

Optionally, a thickness of the medium layer is greater than a depth of the second arc-shaped slot.

Optionally, a thickness of the dissociable-adhesive layer is greater than a depth of the arc-shaped protrusion.

Optionally, the regulating micro-feature comprises a grating, and an orthographic projection of the grating on the transporting base plate and a center region of the orthographic projection of the light-emitting-diode chip on the transporting base plate at least partially overlap.

Optionally, both of a slit width and a passband width of the grating are greater than a wavelength of a dissociating light; and a height of the grating is 1000-3000 A, and both of the slit width and the passband width of the grating are 500-1400 A.

Optionally, an orthographic projection of the grating on the transporting base plate is a third projection, and an orthographic projection of the light-emitting-diode chip on the transporting base plate is a second projection, wherein an area of the third projection is 5%-10% of the area of the second projection.

Optionally, the carrier plate further comprises: a microlens component, and the microlens component is provided on one side of the transporting base plate that is away from the dissociable-adhesive layer; and an orthographic projection of the microlens component on the transporting base plate and a peripheral region of the orthographic projection of the light-emitting-diode chip on the transporting base plate at least partially overlap.

Optionally, the grating is located on one side of the transporting base plate that is closer to the dissociable-adhesive layer.

Optionally, the regulating micro-feature comprises: a plurality of pre-arranged units, orthographic projections of the plurality of pre-arranged units on the transporting base plate and the orthographic projections of the light-emitting-diode chips on the transporting base plate at least partially overlap, a plurality of protrusions are formed on one side of the dissociable-adhesive layer that is away from the transporting base plate, each of the protrusions corresponds to one of the pre-arranged units, and an exhaust passage is formed between the neighboring instances of the protrusions.

Optionally, the pre-arranged units are fabricated by using a transparent material.

Optionally, a height of the pre-arranged units is 15000-20000 A, and widths of the pre-arranged units in all directions are greater than or equal to 2.5 μm.

Optionally, each of the light-emitting-diode chips is provided with a plurality of instances of the pre-arranged units, and two neighboring instances of the pre-arranged units have a distance therebetween.

Optionally, the dissociable-adhesive layer comprises: a laser dissociation layer and a viscous-adhesive-material layer, the laser dissociation layer is located on one side of the transporting base plate that is closer to the light-emitting-diode chips, and the viscous-adhesive-material layer is located between the laser dissociation layer and the light-emitting-diode chips; and the viscous-adhesive-material layer is provided with a first micro-feature on side that is closer to the laser dissociation layer, the laser dissociation layer is provided with a second micro-feature on side that is closer to the viscous-adhesive-material layer, a shape of the second micro-feature and a shape of the first micro-feature are complementary, and the second micro-feature and the first micro-feature are embedded into each other.

Optionally, a thickness of the laser dissociation layer is 1-3 μm, and a thickness of the viscous-adhesive-material layer is 1-10 μm.

Optionally, the first micro-feature is a nanometer micro-feature, and the first micro-feature is selected from at least one of a circular-cone-shaped micro-feature and a rhombic micro-feature.

Optionally, the first micro-feature is of a cone, a height of the cone is 0.2-1p m, a diameter of a bottom of the cone is 100-500 nm, and an included angle between a conical side and the bottom of the cone is 15-60°.

Optionally, a refractive index of the viscous-adhesive-material layer is greater than or equal to 1.5, and a light transmissivity of the viscous-adhesive-material layer is greater than or equal to 97%.

In the second aspect, an embodiment of the present disclosure further discloses a transferring device, wherein the transferring device comprises: a plurality of light-emitting-diode chips and the carrier plate according to any one of the above items; and the plurality of light-emitting-diode chips are connected to the dissociable-adhesive layer of the carrier plate.

In the embodiments of the present application, by providing the dissociation regulating feature between the dissociable-adhesive layer and the transporting base plate, in the process of the mass transfer of the light-emitting-diode chips, the dissociation regulating feature can regulate the dissociation accuracy of the dissociable-adhesive layer. Accordingly, position deviation of the light-emitting-diode chips in the process of falling can be prevented, to increase the yield and the dissociation accuracy of the light-emitting-diode chips, which can increase the yield in the process of the mass transfer and the efficiency of the mass transfer of the light-emitting-diode chips.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work.

Figure 1:
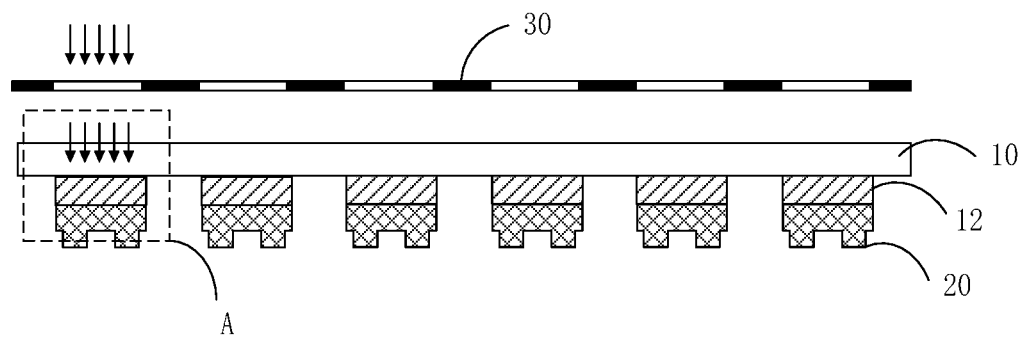
FIG. 1 schematically shows a schematic diagram of the transfer of light-emitting-diode chips by using a conventional carrier plate.

Description of the reference numbers: 10—transporting base plate, 101—first arc-shaped slot, 11—medium layer, 111—second arc-shaped slot, 12—dissociable-adhesive layer, 121—arc-shaped protrusion, 122—protrusion, 123—laser dissociation layer, 1231—second micro-feature, 124—viscous-adhesive-material layer, 1241—first micro-feature, 13—grating, 14—microlens component, 15—pre-arranged units, 20—light-emitting-diode chips, 201—luminescent layer, 202—first electrode, 203—second electrode, 30—mask, S—microcavity, S2—second projection, S3—third projection, L—exhaust passage.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

The features defined by the terms "first" and "second" in the description and the claims of the present application may explicitly or implicitly comprise one or more of the features. In the description of the present disclosure, unless stated otherwise, the meaning of "plurality of" is "two or more". Furthermore, the "and/or" in the description and the claims indicates at least one of the linked objects, and the character "/" generally indicates that the linked objects are of the relation of "or".

In the description of the present disclosure, it should be understood that the terms that indicate orientation or position relations, such as "central", "longitudinal", "transverse", "length", "width", "thickness", "upper", "lower", "front", "rear", "left", "right", "vertical", "horizontal", "top", "bottom", "inner", "outer", "clockwise", "anticlockwise", "axial", "radial" and "circumferential", are based on the orientation or position relations shown in the drawings, and are merely for conveniently describing the present disclosure and simplifying the description, rather than indicating or implying that the device or element must have the specific orientation and be constructed and operated according to the specific orientation. Therefore, they should not be construed as a limitation on the present disclosure.

In the description of the present disclosure, it should be noted that, unless explicitly defined or limited otherwise, the terms "mount", "connect" and "link" should be interpreted broadly. For example, it may be fixed connection, detachable connection, or integral connection; it may be mechanical connection or electrical connection; and it may be direct connection or indirect connection by an intermediate medium, and may be the internal communication between two elements. For a person skilled in the art, the particular meanings of the above terms in the present disclosure may be comprehended according to particular situations.

Figure 2:
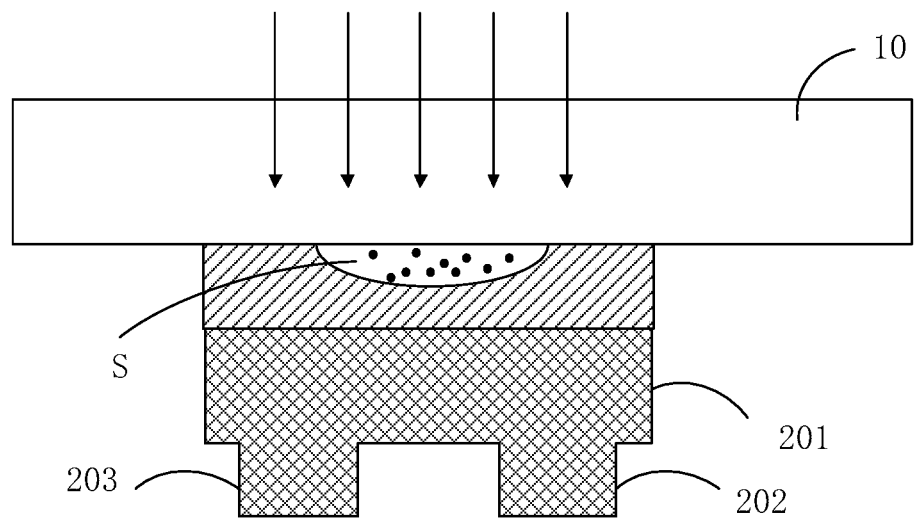
FIG. 2 schematically shows a schematic diagram of the detailed structure of the position A in FIG. 1.

Referring to FIG. 1, a schematic diagram of the transfer of light-emitting-diode chips by using a conventional carrier plate is shown. Referring to FIG. 2, a schematic diagram of the detailed structure of the position A in FIG. 1 is shown. Particularly, the carrier plate may comprise a transporting base plate 10 and a dissociable-adhesive layer 12, and the dissociable-adhesive layer 12 may be configured to be connected to a plurality of light-emitting-diode chips 20.

As shown in FIG. 1, a dissociating light (as shown by the arrow in FIG. 1) may irradiate the dissociable-adhesive layer 12 via a mask. The dissociable-adhesive layer 12, under the irradiation of the dissociating light, can be gasified and dissociated, whereby the light-emitting-diode chips 20 is separated from the transporting base plate 10, and the light-emitting-diode chips 20 may fall and transfer to a driving substrate of the displaying device, to realize the mass transfer of the light-emitting-diode chips 20.

As shown in FIG. 2, when the dissociating light is irradiating the dissociable-adhesive layer 12, because the intensity of the energy of the dissociating light at the center region of dissociable-adhesive layer 12 is greater than the intensity at the peripheral region, the center region of the dissociable-adhesive layer 12 is firstly dissociated to form a microcavity S, and the gas generated by the gasification of the dissociable-adhesive layer 12 exists inside the microcavity 12. After the dissociable-adhesive layer 12 has been entirely dissociated, because of the uncertainty caused by the impact of the gas inside the microcavity S, the light-emitting-diode chips 20 will have deviations in the postures and the positions of the falling, whereby a position deviation of the light-emitting-diode chips 20 in the process of falling is very easily caused, it seriously reduces the yield of the transfer of the light-emitting-diode chips 20, it also reduces the dissociation accuracy of the light-emitting-diode chips 20.

As shown in FIG. 2, the light-emitting-diode chip 20 may comprise a luminescent layer 201 with a sandwich structure, and a first electrode 202 and a second electrode 203 that are provided on the same side of the luminescent layer 201. The luminescent layer 201 may be a semiconductor-film layer, and the semiconductor-film layer may be fabricated by using materials such as P—GaN, MQW and N—GaN. The first electrode 202 may be a positive electrode. The second electrode 203 may be a negative electrode. In the process of the transferring, the side of the light-emitting-diode chip 20 that is not provided with the electrodes may face the dissociable-adhesive layer 12, and the side of the light-emitting-diode chip 20 that is provided with the electrodes may face the driving substrate. After the light-emitting-diode chip 20 has fallen, the first electrode 202 and the second electrode 203 may be fixedly connected to a bonding pad on the driving substrate.

Figure 3:
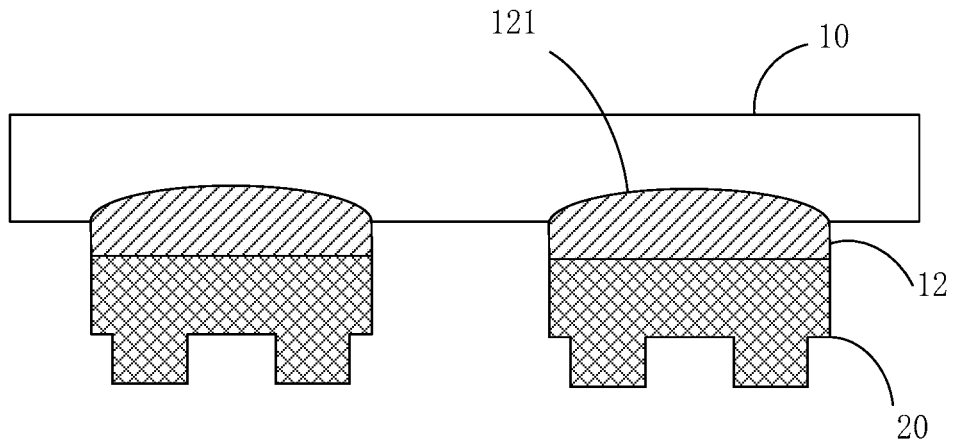
FIG. 3 schematically shows a schematic structural diagram of the carrier plate according to an embodiment of the present application.

Referring to FIG. 3, a schematic structural diagram of the carrier plate according to an embodiment of the present application is shown. As shown in FIG. 3, the carrier plate may particularly comprise: a transporting base plate 10, a dissociation regulating feature and a dissociable-adhesive layer 12 that are sequentially arranged, the dissociation regulating feature may be configured to regulate the dissociation accuracy of the dissociable-adhesive layer 12, and the dissociable-adhesive layer 12 may be configured to be connected to a plurality of light-emitting-diode chips 20.

Particularly, the dissociable-adhesive layer 12 of the carrier plate may be configured to be connected to a plurality of light-emitting-diode chips 20, and the plurality of light-emitting-diode chips 20 may be distributed on the carrier plate in an array. The light-emitting-diode chips 20 may be light-emitting-diode chips that emit the same color or different colors, which is not limited in the embodiments of the present application.

Particularly, the dissociable-adhesive layer 12 may be a laser-dissociable adhesive, it dissociates the dissociable-adhesive layer 12 in the corresponding area by irradiating a laser to some area of the transporting base plate 10, whereby the light-emitting-diode chips 20 in that area are fallen, and transfer to the driving substrate. Alternatively, the dissociable-adhesive layer 12 may also be a pyrolyzed adhesive, and, in this case, it dissociates the dissociable-adhesive layer 12 in the corresponding area by heating some area of the transporting base plate 10, whereby the light-emitting-diode chips 20 in that area is fallen, and transfer to the driving substrate.

For example, when it is required to transfer the light-emitting-diode chips 20 on the transporting base plate 10 to the driving substrate, the transporting base plate 10 may, based on the direction of gravity, be provided above the driving substrate, that is, the transporting base plate 10 and the driving substrate are sequentially arranged in the direction of gravity, whereby the light-emitting-diode chips 20 on the transporting base plate 10 that are required to be transferred can be transferred to the driving substrate by using gravity in cooperation with the dissociable-adhesive layer 12.

In the embodiments of the present application, because of the dissociation regulating feature between the dissociable-adhesive layer 12 and the transporting base plate 10, in the process of the mass transfer of the light-emitting-diode chips 20, the dissociation regulating feature can regulate the dissociation accuracy of the dissociable-adhesive layer 12. Accordingly, a position deviation of the light-emitting-diode chips 20 in the process of falling can be prevented, it increases the yield and the dissociation accuracy of the light-emitting-diode chips 20, whereby it can increase the yield in the process of the mass transfer and the efficiency of the mass transfer of the light-emitting-diode chips 20.

In some alternative embodiments of the present application, the dissociation regulating feature may comprise a plurality of regulating micro-features, and each of the regulating micro-features corresponds to one of the light-emitting-diode chips 20. The orthographic projection of the regulating micro-feature on the transporting base plate 10 is a first projection, and the orthographic projection of the light-emitting-diode chip 20 on the transporting base plate 10 is a second projection. The first projection of each of the regulating micro-features and the second projection of the light-emitting-diode chip 20 correspondingly to the first projection are thereto at least partially overlapped, and the area of the first projection is less than or equal to the area of the second projection.

Particularly, the regulating micro-feature may be a pattern and a micro-feature, and may also be a grating, a microlens, a pre-provided feature and so on. The micro-feature can optimize the interface morphology of the dissociable-adhesive layer 12. Accordingly, the dissociable-adhesive layer 12 can automatically exhaust gas by the periphery in the process of dissociation. By providing a regulating micro-feature correspondingly to each of the light-emitting-diode chips 20, the problem of deviation of the light-emitting-diode chips 20 caused by unsmooth gas exhaustion can be effectively solved.

As an example, the regulating micro-feature may be provided at the center region of the light-emitting-diode chip 20, whereby the first projection and the center region of the second projection are overlapped. Alternatively, the regulating micro-feature may also be provided at the peripheral region of the light-emitting-diode chip 20, whereby the first projection and the peripheral region of the second projection are overlapped. Alternatively, the regulating micro-feature may also be provided at the entire outer-surface region of the entire light-emitting-diode chip 20, whereby the first projection and the second projection are completely overlapped. The particular position of the regulating micro-feature relative to the light-emitting-diode chip 20 is not limited in the present application.

As shown in FIG. 3, the regulating micro-feature may particularly comprise: an arc-shaped protrusion 121 provided on the one side of the dissociable-adhesive layer 12 that is closer to the transporting base plate 10.

Figure 4:
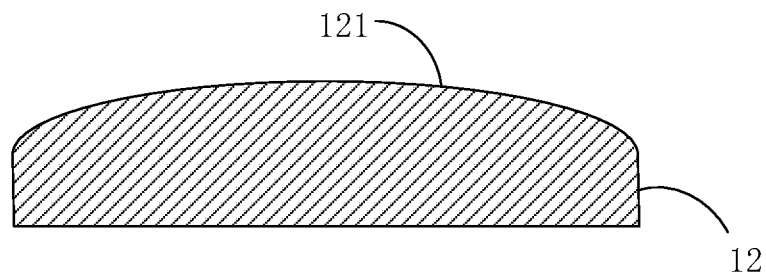
FIG. 4 schematically shows a schematic structural diagram of the dissociable-adhesive layer according to an embodiment of the present application.

Referring to FIG. 4, a schematic structural diagram of the dissociable-adhesive layer according to an embodiment of the present application is shown. As shown in FIG. 4, because the dissociable-adhesive layer 12 is provided with the arc-shaped protrusion 121 on the side that is closer to the transporting base plate 10, the thickness of the center region of the dissociable-adhesive layer 12 is greater than the thickness of the peripheral region, and, in order to reach the same degree of dissociation, the energy of the dissociating light required by the center region of the dissociable-adhesive layer 12 is more than the energy of the dissociating light required by the peripheral region. Moreover, when the dissociating light is irradiating the arc-shaped protrusion 121, the energy of the dissociating light irradiating the arc-shaped protrusion 121 generally progressively decreases from the center region to the peripheral region. Accordingly, by providing the arc-shaped protrusion 121 on the dissociable-adhesive layer 12, the progressive decreasing of the thickness of the dissociable-adhesive layer 12 from the center region to the peripheral region can be realized, which is adapted for the energy distribution of the dissociating light. As a result, the center region and the peripheral region of the dissociable-adhesive layer 12 can realize dissociation with the equal degrees, to prevent the microcavity and the gas generated by the earlier dissociation of the center region of the dissociable-adhesive layer 12, whereby it can prevent gas impact and position deviation of the light-emitting-diode chips 20 in the process of falling, and it increases the yield and the dissociation accuracy of the light-emitting-diode chips 20, thereby increasing the yield in the process of the mass transfer and the efficiency of the mass transfer of the light-emitting-diode chips 20.

It should be noted that, in practical applications, the radian of the arc-shaped protrusion 121 may be set according to the energy distribution of the dissociating light. The radian of the arc-shaped protrusion is not particularly limited in the embodiments of the present application.

Figure 5:
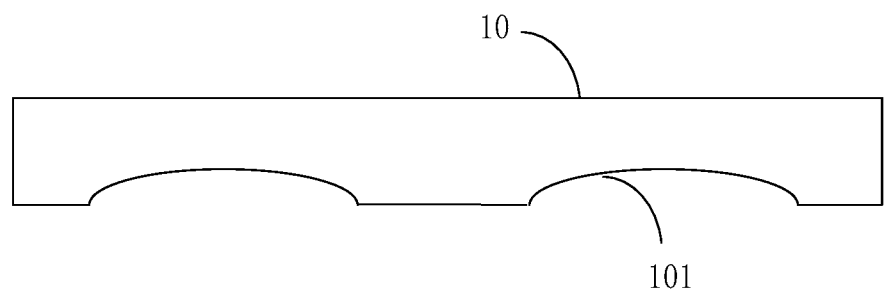
FIG. 5 schematically shows a schematic structural diagram of the transporting base plate in the carrier plate shown in FIG. 3.

Referring to FIG. 5, a schematic structural diagram of the transporting base plate in the carrier plate shown in FIG. 3 is shown. As shown in FIG. 5, the transporting base plate 10 is provided with a first arc-shaped slot 101 at the position facing the arc-shaped protrusion 121, the shape of the first arc-shaped slot 101 and the shape of the arc-shaped protrusion 121 are matched, and the arc-shaped protrusion 121 is embedded in the first arc-shaped slot 101.

In an embodiment of the present application, the first arc-shaped slot 101 may be firstly formed on the transporting base plate 10, and then a dissociable adhesive may be spread-coated onto the one side where the first arc-shaped slot 101 is formed, whereby the dissociable adhesive can flow into the first arc-shaped slot 101. Accordingly, the arc-shaped protrusion 121 can be formed on the finally formed dissociable-adhesive layer 12. By directly forming the first arc-shaped slot 101 on the transporting base plate 10, the carrier plate can have a simple structure and a low height.

Particularly, the shape matching between the first arc-shaped slot 101 and the arc-shaped protrusion 121 may particularly include: that the shapes of the first arc-shaped slot 101 and the arc-shaped protrusion 121 are the same, or that the first arc-shaped slot 101 is slightly larger than the arc-shaped protrusion 121, to facilitate to form the arc-shaped protrusion 121 inside the first arc-shaped slot 101.

Figure 6:
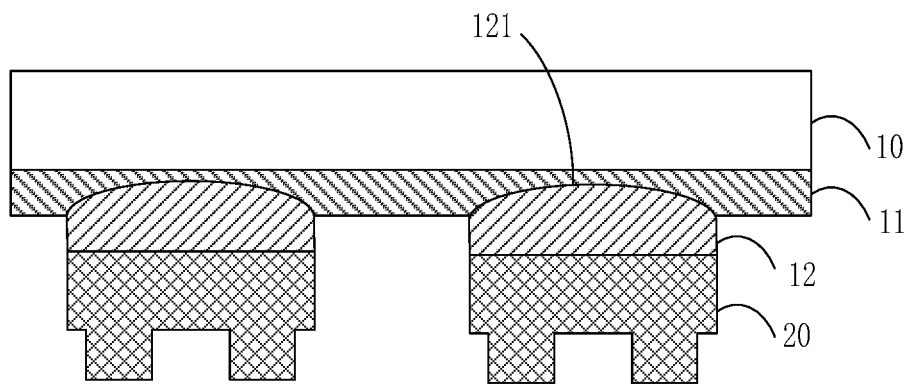
FIG. 6 schematically shows a schematic structural diagram of the carrier plate according to another embodiment of the present application.
Figure 7:
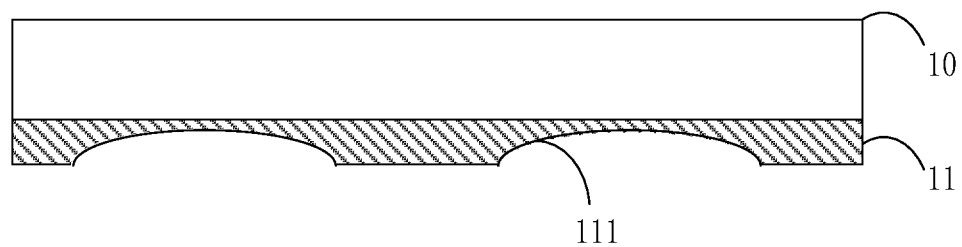
FIG. 7 schematically shows a schematic structural diagram of the carrier plate shown in FIG. 6 when the dissociable-adhesive layer has been removed.

Referring to FIG. 6, a schematic structural diagram of the carrier plate according to another embodiment of the present application is shown. Referring to FIG. 7, a schematic structural diagram of the carrier plate shown in FIG. 6 when the dissociable-adhesive layer has been removed is shown. As shown in FIG. 6, the carrier plate may further comprise: a medium layer 11, the medium layer 11 is provided between the transporting base plate 10 and the dissociable-adhesive layer 12, the medium layer 11 is provided with a second arc-shaped slot 111 at the position facing the arc-shaped protrusion 121, the shape of the second arc-shaped slot 111 and the shape of the arc-shaped protrusion 121 match, and the arc-shaped protrusion 121 is embedded in the second arc-shaped slot 111.

In particular applications, because the transporting base plate 10 is usually fabricated by glass, the processes for directly processing the transporting base plate 10 to form the arc-shaped slot are usually complicated and have a high cost. In order to reduce the process complexity and reduce the cost, before forming the dissociable-adhesive layer 12, the process may comprise firstly forming a medium layer 11 on the transporting base plate 10, then forming the second arc-shaped slot 111 on the medium layer 11, which has a simpler process, and finally spread-coating the dissociable adhesive onto the medium layer 11, to form the dissociable-adhesive layer 12 having the arc-shaped protrusion 121. That can avoid the operation of directly processing an arc-shaped slot on the transporting base plate 10 of a glass material.

Optionally, the material of the medium layer 11 may be at least one of silicon oxide and silicon nitride. In practical applications, by using silicon oxide or silicon nitride as the material of the medium layer 11 can facilitate the process of lithography on the medium layer 11. Particularly, a depression having a certain radian is formed by lithography process, that is the second arc-shaped slot 111, correspondingly at the position where the light-emitting-diode chip 20 is required to be connected, and then spread-coating the dissociable adhesive onto the one side of the medium layer 111 where the second arc-shaped slot 111 is formed, whereby the dissociable adhesive can flow into the second arc-shaped slot 111. Accordingly, the arc-shaped protrusion 121 can be formed on the finally formed dissociable-adhesive layer 12. The second arc-shaped slot 111 on the medium layer 11 is formed by lithography the processing, processing of the second arc-shaped slot 111 can be simpler and have a lower cost.

Particularly, the shape matching between the second arc-shaped slot 111 and the arc-shaped protrusion 121 may particularly include: that the shapes of the second arc-shaped slot 111 and the arc-shaped protrusion 121 are the same, or that the second arc-shaped slot 111 is slightly larger than the arc-shaped protrusion 121, to form the arc-shaped protrusion 121 inside the second arc-shaped slot 111 facilitatly.

Optionally, the thickness of the medium layer 11 may be greater than the depth of the second arc-shaped slot 111, to form an intact second arc-shaped slot 111 on the medium layer 11 facilitatly. Etching off the entire medium layer 11 and exposing the transporting base plate 10 can be prevented in the process of lithography, it improves the regularity and the intactness of the second arc-shaped slot 111 on the medium layer 11, thereby facilitating to obtain an intact arc-shaped protrusion 121 of a regular shape.

It should be noted that the depth of the second arc-shaped slot 111 may particularly be the depth corresponding to the deepest position of the depression of the second arc-shaped slot 111.

As an example, when the depth of the second arc-shaped slot 111 is greater than or equal to 1000 A, the thickness of the medium layer 11 may be 5000-10000 A. The depth of the second arc-shaped slot 111 is greater than or equal to 1000 A, and is less than the thickness of the medium layer 11.

In some alternative embodiments of the present application, the thickness of the dissociable-adhesive layer 12 is greater than the depth of the arc-shaped protrusion 121, to realize a reliable adhesion of the light-emitting-diode chips 21 to the transporting base plate 10.

It should be noted that the depth of the arc-shaped protrusion 121 may particularly be the depth corresponding to the highest position of the protrusion of the arc-shaped protrusion 121.

Particularly, the thickness of the dissociable-adhesive layer 12 may be determined according to practical effects. For example, the thickness of the dissociable-adhesive layer 12 may be 1-5 μm, and, correspondingly, the thickness of the medium layer 11 may be greater than 3000 A, and the depth of the arc-shaped protrusion 121 may be 500-2500 A.

Figure 8:
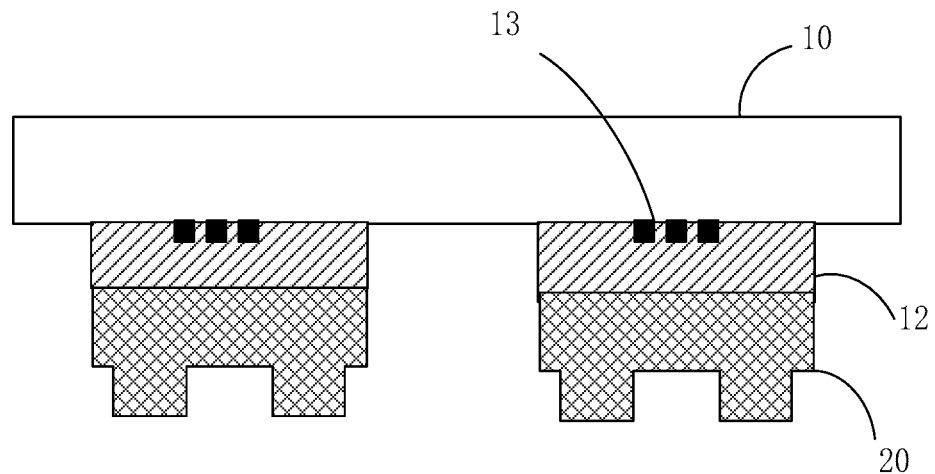
FIG. 8 schematically shows a schematic structural diagram of the carrier plate according to another embodiment of the present application.

Referring to FIG. 8, a schematic structural diagram of the carrier plate according to another embodiment of the present application is shown. As shown in FIG. 8, the regulating micro-feature may comprise a grating 13, and the orthographic projection of the grating 13 on the transporting base plate 10 and the center region of the orthographic projection of the light-emitting-diode chip 20 on the transporting base plate 10 are at least partially overlapped.

Particularly, the center region of the orthographic projection of the light-emitting-diode chip 20 on the transporting base plate 10 may be: the area covered by a circle that is drawn with the orthographic projection of the center of the light-emitting-diode chip 20 as the center and a preset distance as the radius, wherein the preset distance may be 10%-50% of the distance from the center of the light-emitting-diode chip 20 to the edge. Alternatively, the center region may also be the area adjacent to the orthographic projection of the center of the light-emitting-diode chip 20. In the orthographic projection of the light-emitting-diode chip 20 on the transporting base plate 10, the area outside the center region may be the peripheral region.

In practical applications, the grating 13 may be located on the one side of the transporting base plate 10 that is closer to the dissociable-adhesive layer 12. When the dissociating light enters from the side of the transporting base plate 10, a diffraction may happen at the grating 13, to reduce the energy of the dissociating light. In an embodiment of the present application, by providing the grating 13 at the center region of the dissociable-adhesive layer 12, the orthographic projection of the grating 13 on the transporting base plate 10 and the center region of the orthographic projection of the light-emitting-diode chip 20 on the transporting base plate 10 can be at least partially overlapped. Because of the function of diffraction of the grating 13, the energy of the dissociating light irradiating the center region of the dissociable-adhesive layer 12 can be reduced, which can enable the light rays irradiating the center region and the peripheral region of the dissociable-adhesive layer 12. As a result, the center region and the peripheral region of the dissociable-adhesive layer 12 can realize dissociation with the equal degrees, it prevents the microcavity and the gas generated by the earlier dissociation of the center region of the dissociable-adhesive layer 12, whereby it can prevent gas impact and position deviation of the light-emitting-diode chips 20 in the process of falling, and it also can increase the yield and the dissociation accuracy of the light-emitting-diode chips 20, thereby increasing the yield in the process of the mass transfer and the efficiency of the mass transfer of the light-emitting-diode chips 20.

In an embodiment of the present application, both of the slit width and the passband width of the grating 13 are greater than the wavelength of a dissociating light, whereby the dissociating light can have a better diffraction at the grating 13. For example, when the wavelength of the dissociating light is 266-355 nm, the slit width and the passband width of the grating 13 may be 500-1400 A.

As an example, the height of the grating 13 may be 1000-3000 A. Because the height of the grating 13 is lower, when the dissociable adhesive continues to be spread-coated onto the grating 13, it is difficult to obviously protrude on the surface of the dissociable-adhesive layer 12, and the surface of the dissociable-adhesive layer 12 is relatively even, which can realize the reliability of the connection of the light-emitting-diode chips.

Figure 9:
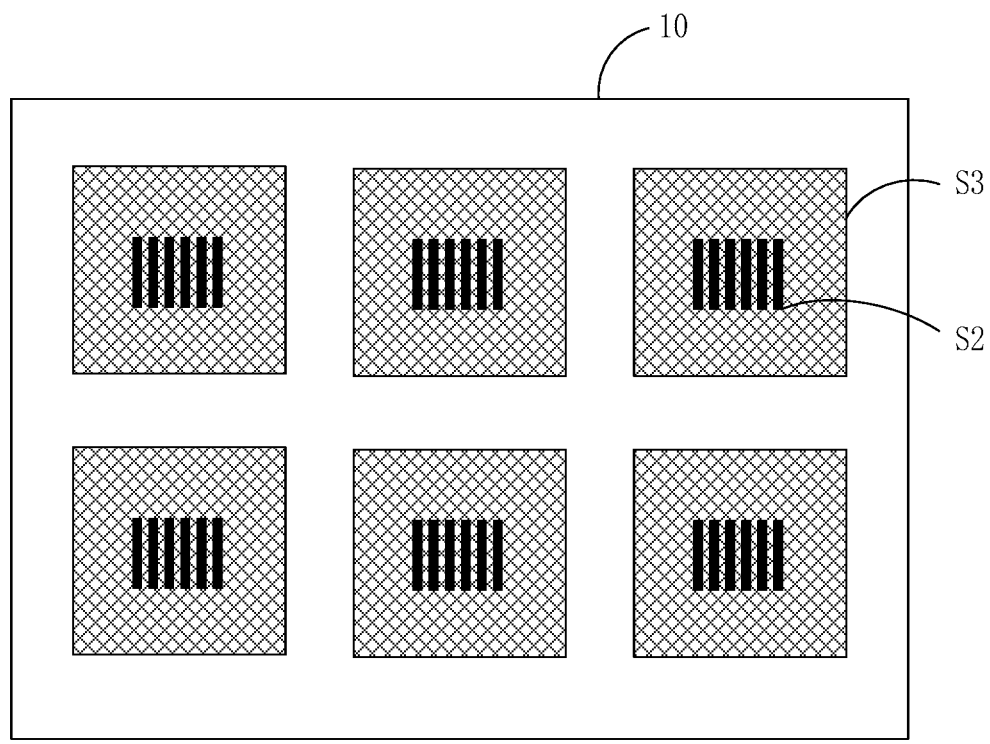
FIG. 9 schematically shows a schematic structural top diagram of the carrier plate shown in FIG. 8.

Referring to FIG. 9, a schematic structural top diagram of the carrier plate shown in FIG. 8 is shown. As shown in FIG. 9, the orthographic projection of the grating 13 on the transporting base plate 10 is a third projection S3, and the orthographic projection of the light-emitting-diode chip 20 on the transporting base plate 10 is a second projection S2. As shown in FIG. 9, the third projection S3 and the center region of the second projection S2 may be overlapped.

In particular applications, when the uniformity of the dissociating light is 5%, the area of the third projection S3 is 5%-10% of the area of the second projection S2, the uniformity of the irradiation by the dissociating light onto the dissociable-adhesive layer 20 is improved, it enables the center region and the peripheral region of the dissociable-adhesive layer 12 to be dissociated synchronously. As an example, in order to balance the uniformity of the dissociating light and the surface smoothness of the dissociable-adhesive layer 12, the area of the third projection S3 may be not greater than 7% of the area of the second projection S2.

Figure 10:
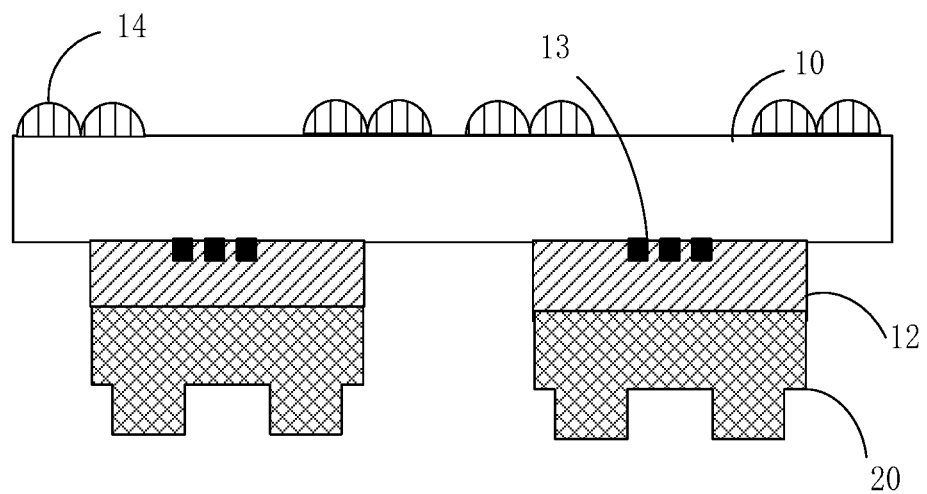
FIG. 10 schematically shows a schematic structural diagram of the carrier plate according to yet another embodiment of the present application.

Referring to FIG. 10, a schematic structural diagram of the carrier plate according to yet another embodiment of the present application is shown. As shown in FIG. 10, based on the carrier plate shown in FIG. 8, the carrier plate shown in FIG. 10 may comprise: a microlens component 14, and the microlens component 14 is provided on the one side of the transporting base plate 10 that is away from the dissociable-adhesive layer 12. The microlens component 14 may be used to perform energy convergence, and regulate the uniformity of the dissociating light entering the transporting base plate 10, which can enable the center region and the peripheral region of the dissociable-adhesive layer 12 to be dissociated synchronously.

In practical applications, the microlens component 14 may be, according to actual situations, provided at a region where the dissociating light is weaker. In an alternative embodiment of the present application, the orthographic projection of the microlens component 14 on the transporting base plate 10 and the peripheral region of the orthographic projection of the light-emitting-diode chip 20 on the transporting base plate 10 are at least partially overlapped. In other words, the microlens component 14 may be provided at a position corresponding to the peripheral region of the light-emitting-diode chip 20.

In practical applications, because the regions of the weakly dissociated light are concentrated at the position corresponding to the peripheral region of the light-emitting-diode chip 20, by providing the microlens component 14 at the position corresponding to the peripheral region of the light-emitting-diode chip 20, the microlens component 14 can be used to perform energy convergence to the dissociating light at the peripheral region of the light-emitting-diode chip 20.

It should be noted that the arrangement area of the microlens component 14 may be determined according to actual situations of the dissociating light, and the arrangement area of the microlens component 14 is not particularly limited in the embodiments of the present application. The material of the microlens component 14 is a conventional lens material, such as a light transmitting resin or a glass. The curvature radius of the microlens component 14 is determined according to the actual effect of light focusing, and is not limited in the embodiments of the present application.

Figure 11:
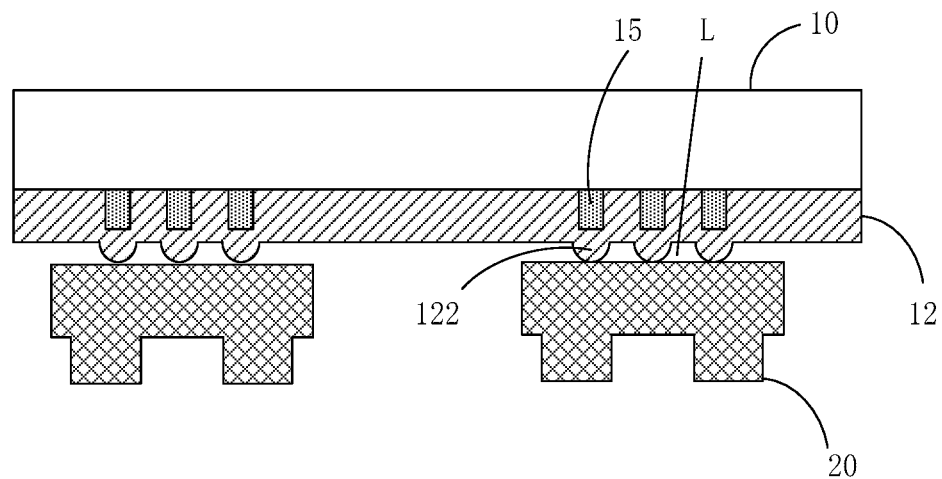
FIG. 11 schematically shows a schematic structural diagram of the carrier plate according to yet another embodiment of the present application.

Referring to FIG. 11, a schematic structural diagram of the carrier plate according to yet another embodiment of the present application is shown. As shown in FIG. 11, the regulating micro-feature may comprise: a plurality of pre-arranged units 15, the orthographic projections of the plurality of pre-arranged units 15 on the transporting base plate 10 and the orthographic projection of the light-emitting-diode chips 20 on the transporting base plate 10 are at least partially overlapped, a plurality of protrusions 122 are formed on the one side of the dissociable-adhesive layer 12 that is away from the transporting base plate 10, each of the protrusions 122 corresponds to one of the pre-arranged units 15, and an exhaust passage L is formed between the neighboring protrusions 122. Accordingly, the gas generated by the dissociation and gasification of the dissociable-adhesive layer 12 can be discharged from the exhaust passage L, which can enable the light-emitting-diode chips 20 to prevent being impacted by the gas in the process of falling, and prevent position deviation of the light-emitting-diode chips 20 in the process of falling, and increase the yield and the dissociation accuracy of the light-emitting-diode chips 20, thereby increasing the yield in the process of the mass transfer and the efficiency of the mass transfer of the light-emitting-diode chips 20.

Figure 12:
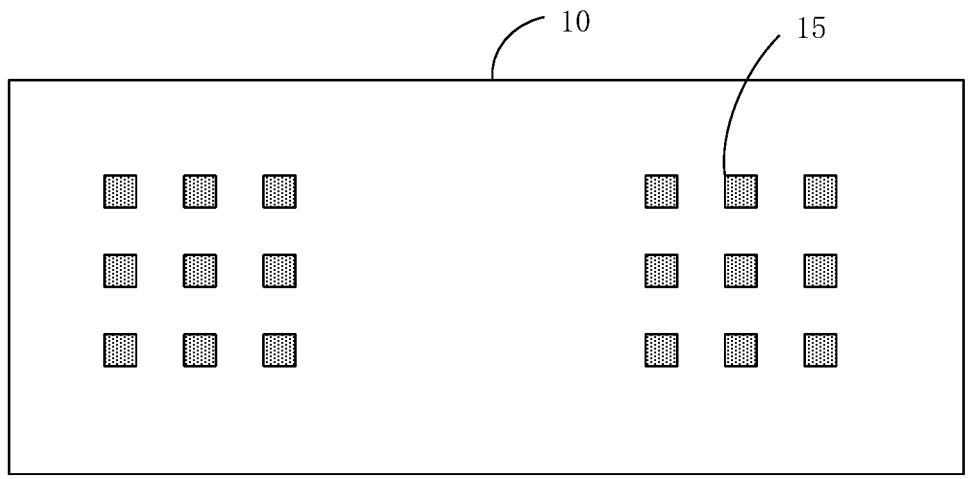
FIG. 12 schematically shows a first processing-state diagram of the carrier plate shown in FIG. 11.

Referring to FIG. 12, a first processing-state diagram of the carrier plate shown in FIG. 11 is shown. As shown in FIG. 12, in particular applications, in the process of processing the carrier plate, firstly, a plurality of pre-arranged units 15 that are distributed in an array may be provided correspondingly at the positions of the transporting base plate 10 where the light-emitting-diode chips 20 are required to be connected.

It should be noted that, in practical applications, the transporting base plate 10 and the pre-arranged units 15 may be designed to be an integral structure, and the transporting base plate 10 and the pre-arranged units 15 may also be designed to be a separate structure. The connection mode between the transporting base plate 10 and the pre-arranged units 15 is not limited in the embodiments of the present application.

Figure 13:
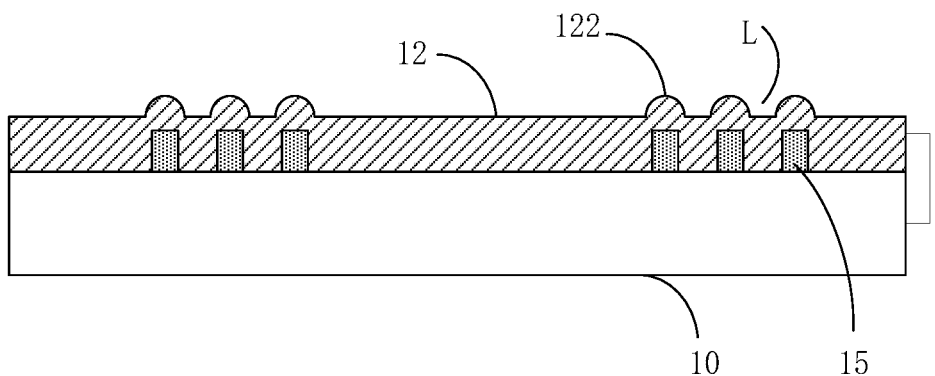
FIG. 13 schematically shows a second processing-state diagram of the carrier plate shown in FIG. 11.

Referring to FIG. 13, a second processing-state diagram of the carrier plate shown in FIG. 11 is shown. As shown in FIG. 13, after the plurality of pre-arranged units 15 have been provided on the transporting base plate 10, the dissociable adhesive may be spread-coated on the one side of the transporting base plate 10 where the pre-arranged units 15 are provided to form the dissociable-adhesive layer 12.

Particularly, because of the blocking function of the pre-arranged units 15, the pre-arranged units 15 prevent the dissociable adhesive from flowing, and, moreover, because of a certain viscosity of the dissociable adhesive, it is difficult to level the positions of the pre-arranged units 15 by the fluidity of the dissociable adhesive. Accordingly, the protrusions 122 are formed at the positions corresponding to the pre-arranged units 15, whereby an exhaust passage L is formed between the neighboring protrusions 122. In the dissociation processing of the dissociable-adhesive layer 12, the gas generated by the dissociation and gasification of the dissociable-adhesive layer 12 can be discharged from the exhaust passage L, whereby it can enable the light-emitting-diode chips 20 to prevent being impacted by the gas in the process of falling, and it can also prevent position deviation of the light-emitting-diode chips 20 in the process of falling, and increase the yield and the dissociation accuracy of the light-emitting-diode chips 20.

In an embodiment of the present application, the pre-arranged units 15 may be fabricated by using a transparent material, which can enable the dissociating light to transmit the pre-arranged units 15 and irradiate the dissociable-adhesive layer 12, to prevent influence by the pre-arranged units 15 on the intensity of the dissociating light. As an example, the transparent material may be selected from at least one of silicon oxide and silicon nitride. The transparent material is not particularly limited in the embodiments of the present application.

As an example, the height of the pre-arranged units 15 may be 15000-20000 A, whereby the pre-arranged units 15 can perform an effective blocking to the dissociable adhesive, to form the regular protrusions 122 on the surface of the dissociable-adhesive layer 12.

Certainly, in practical applications, the height of the pre-arranged units 15 is required to be determined according to the actual thickness of the dissociable-adhesive layer 12, wherein if the thickness of the dissociable-adhesive layer 12 is higher, the height of the pre-arranged units 15 is correspondingly higher. Generally, in order to realize a good effect of blocking, the difference between the height of the pre-arranged units 15 and the height of the dissociable-adhesive layer 12 should be less than or equal to 1p m.

As an example, the widths of the pre-arranged units 15 in all directions should be greater than or equal to 2.5 µm, whereby the pre-arranged units 15 have a good processability.

As an example, the cross-sectional shape of the pre-arranged units 15 may include but is not limited to circle, rectangle or another polygon. The particular shape of the pre-arranged units 15 is not limited in the embodiments of the present application. When the cross-sectional shape of the pre-arranged units 15 is a circle, the diameter of the circle should be greater than or equal to 2.5 µm. When the cross-sectional shape of the pre-arranged units 15 is a rectangle, the shortest side length of the rectangle should be greater than or equal to 2.5 µm.

In some alternative embodiments of the present application, each of the light-emitting-diode chips 20 is provided with a plurality of pre-arranged units 15, and two neighboring pre-arranged units 15 have a distance therebetween. That can facilitate to form a plurality of mutually independent exhaust passages L between the light-emitting-diode chips 20 and the dissociable-adhesive layer 12, to further improve the stability of the gas exhaustion.

Figure 14:
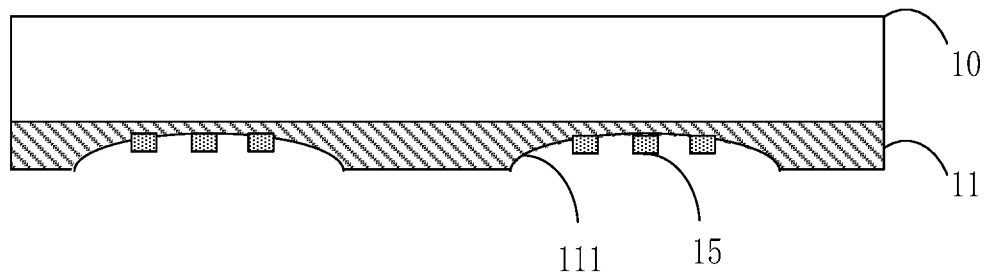
FIG. 14 schematically shows a schematic structural diagram of the carrier plate according to another embodiment of the present application.

Referring to FIG. 14, a schematic structural diagram of the carrier plate according to another embodiment of the present application is shown. As shown in FIG. 14, the carrier plate may comprise: the medium layer 11, the medium layer 11 is provided with a second arc-shaped slot 111 at the position facing the arc-shaped protrusion 121, and pre-arranged units 15 are provided on the one side of the second arc-shaped slot 111 that is away from the transporting base plate 10. That can enable the arc-shaped protrusion 121 to be formed on the finally formed dissociable-adhesive layer 12, and a plurality of mutually independent exhaust passages L is formed between the light-emitting-diode chips 20 and the dissociable-adhesive layer 12 facilitatly, to further improve the stability of the gas exhaustion, whereby it can prevent position deviation of the light-emitting-diode chips 20 in the process of falling, and it also can increase the yield and the dissociation accuracy of the light-emitting-diode chips 20, thereby increasing the yield in the process of the mass transfer and the efficiency of the mass transfer of the light-emitting-diode chips 20.

In practical applications, the material of the pre-arranged units 15 may be a photoresist, and the pre-arranged units 15 inside the second arc-shaped slot 111 may be fabricated by using a mask.

Figure 15:
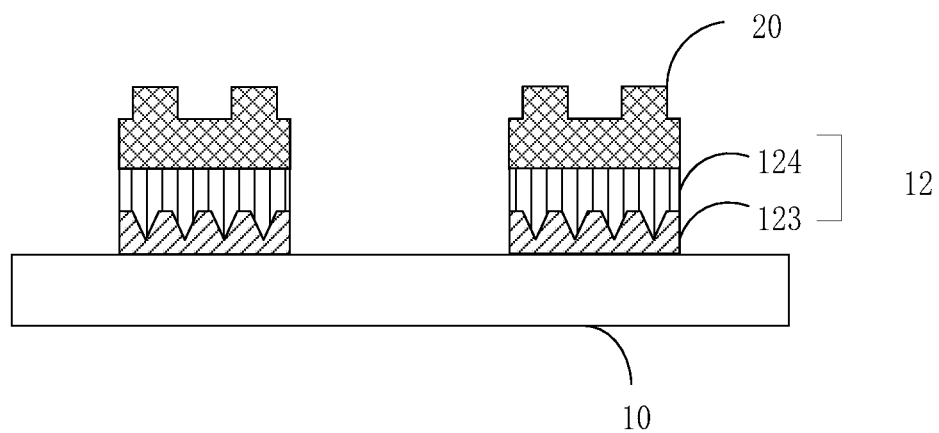
FIG. 15 schematically shows a schematic structural diagram of the carrier plate according to still another embodiment of the present application.

Referring to FIG. 15, a schematic structural diagram of the carrier plate according to still another embodiment of the present application is shown. As shown in FIG. 15, the dissociable-adhesive layer 12 may comprise: a laser dissociation layer 123 and a viscous-adhesive-material layer 124, the laser dissociation layer 123 is located on the one side of the transporting base plate 10 that is closer to the light-emitting-diode chips 20, and the viscous-adhesive-material layer 124 is located between the laser dissociation layer 123 and the light-emitting-diode chips 20. The viscous-adhesive-material layer 124 is provided with a first micro-feature 1241 on the side that is closer to the laser dissociation layer 123, the laser dissociation layer 123 is provided with a second micro-feature 1231 on the side that is closer to the viscous-adhesive-material layer 124, the shape of the second micro-feature 1231 and the shape of the first micro-feature 1241 are complementary, and the second micro-feature 1231 and the first micro-feature 1241 are embedded into each other.

In an embodiment of the present application, when the dissociating light is irradiating the dissociable-adhesive layer 12, under the irradiation of the dissociating light, the laser dissociation layer 123 can be gasified and dissociated, and the viscous-adhesive-material layer 124 can fall together with the light-emitting-diode chips 20. Because the viscous-adhesive-material layer 124 is provided with the first micro-feature 1241 on the side that is closer to the laser dissociation layer 123, the first micro-feature 1241 can be used to serve as a light extracting member, and it is not required to remove the viscous-adhesive-material layer 124 on the light-emitting-diode chips 20, which avoids the operation of removing residual adhesive from the light-emitting-diode chips 20, and further increases the efficiency of the mass transfer of the light-emitting-diode chips 20.

It should be noted that, in the carrier plate shown in FIG. 15, in order to simplify the illustration, the regulating micro-feature provided between the dissociable-adhesive layer 12 and the transporting base plate 10 is not illustrated. However, in practical applications, in the carrier plate shown in FIG. 15, the regulating micro-feature may be provided between the dissociable-adhesive layer 12 and the transporting base plate 10. The regulating micro-feature may include but is not limited to any one of the arc-shaped protrusion, the grating and the pre-arranged units according to the above-described embodiments, which is not limited in the embodiments of the present application.

Optionally, the first micro-feature 1241 may be a nanometer micro-feature, whereby the first micro-feature 1241 can serve as a nanometer microlens, to realize a good effect of light extraction.

As an example, the first micro-feature 1241 may be selected from at least one of a circular-cone-shaped micro-feature and a rhombic micro-feature. The shape of the first micro-feature 1241 is not particularly limited in the embodiments of the present application.

In an alternative embodiment of the present application, when the first micro-feature 1241 is a cone, the height of the cone is 0.2-1 µm, the diameter of the bottom of the cone is 100-500 nm, and the included angle between the side face and the bottom of the cone is 15-60°, to enable the first micro-feature 1241 to realize a good effect of light extraction.

As an example, the thickness of the laser dissociation layer 123 is 1-3 µm, whereby the laser dissociation layer 123 cannot only realize a good effect of adhesion, but also has a high dissociation efficiency. The thickness of the viscous-adhesive-material layer 124 is 1-10 µm, whereby the viscous-adhesive-material layer 124 cannot only be reliably connected to the light-emitting-diode chips 20, but can also realize a good effect of light extraction.

In an embodiment of the present application, the refractive index of the viscous-adhesive-material layer 124 is greater than or equal to 1.5, and the light transmissivity of the viscous-adhesive-material layer 124 is greater than or equal to 97%, whereby the viscous-adhesive-material layer 124 can have a good light transmission, to realize a good effect of light extraction.

Figure 16:
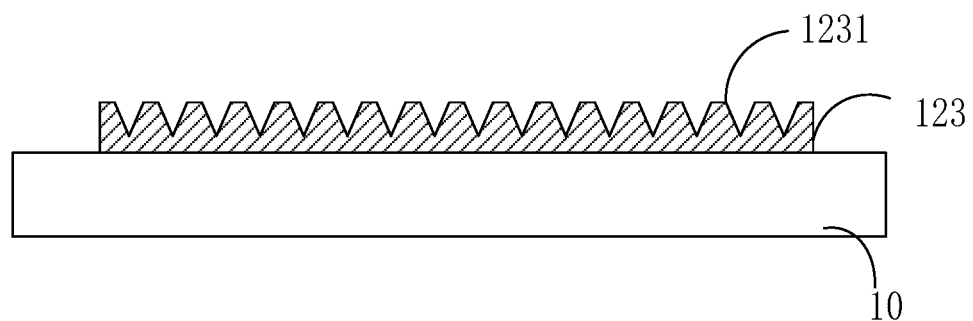
FIG. 16 schematically shows a first particular schematic processing diagram of the carrier plate shown in FIG. 15.

Referring to FIGS. 16 to 19, a schematic processing diagrams of the carrier plate shown in FIG. 15 is provided particularly. As shown in FIG. 16, firstly, a laser-dissociable adhesive may be spread-coated onto the transporting base plate 10. As an example, a 1-3 µm thick dissociable-adhesive layer may be spread-coated for the corresponding solidification. After the solidification has completed, the surface of the dissociable-adhesive layer may be processed to form the second micro-feature 1231, to obtain a sawtooth-shaped laser dissociation layer 123. As an example, the second micro-feature 1231 may be formed at the surface of the laser dissociation layer 123 by processes of nanometer impression or photolithographic etching. The particular process of forming the second micro-feature 1231 is not limited in the embodiments of the present application.

Figure 17:
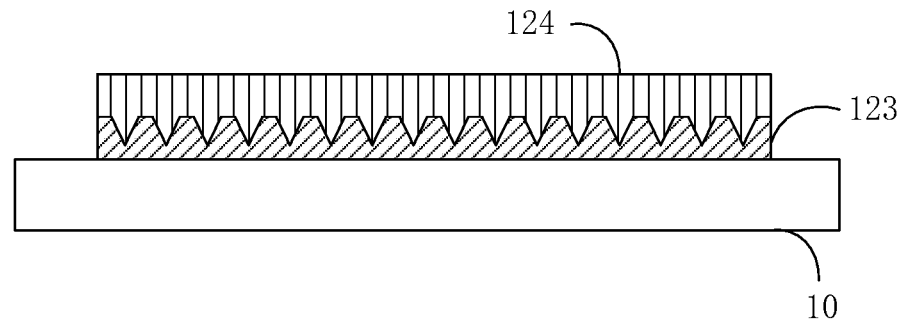
FIG. 17 schematically shows a second particular schematic processing diagram of the carrier plate shown in FIG. 15.

As shown in FIG. 17, when the second micro-feature 1231 has been formed on the laser dissociation layer 123, a viscous material may be spread-coated onto the laser dissociation layer 124, to form the viscous-adhesive-material layer 124. Because of the levelling property of the viscous material, after being spread-coated and fixed, the viscous-adhesive-material layer 124 automatically generates the effects of planarization and filling on the side that is closer to the laser dissociation layer 124, to form the first micro-feature 1241 whose shape is complementary with the second micro-feature 1231. Furthermore, the second micro-feature 1241 and the first micro-feature 1231 may be embedded into each other.

Figure 18:
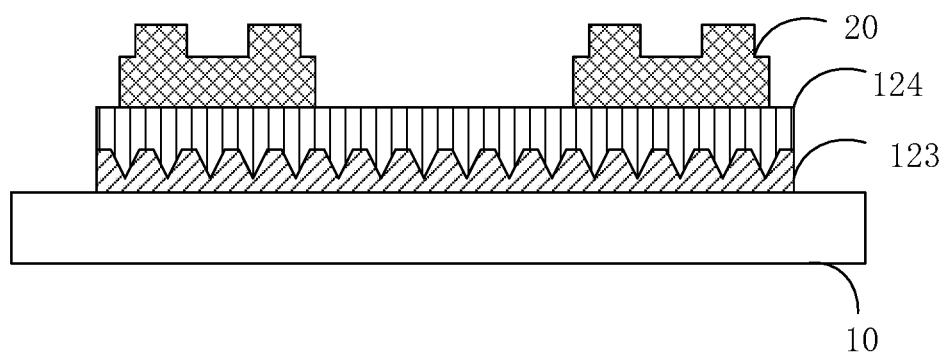
FIG. 18 schematically shows a third particular schematic processing diagram of the carrier plate shown in FIG. 15.

As shown in FIG. 18, after the viscous-adhesive-material layer 124 has been completed, the light-emitting-diode chips 20 may be bound with the viscous-adhesive-material layer 124, to bind the light-emitting-diode chips 20 onto the transporting base plate 20. It should be noted that, in the process of the binding of the light-emitting-diode chips 20, it is required to solidify the viscous-adhesive-material layer 124. The particular solidifying process may comprise: pressurizing and heating→maintaining for a certain duration (5 min)→high-temperature solidification (230° C.).

In practical applications, after the structure in FIG. 18 has been formed, a mask may be used to perform ashing treatment to the dissociable-adhesive layer 12, to obtain the carrier plate shown in FIG. 15.

Figure 19:
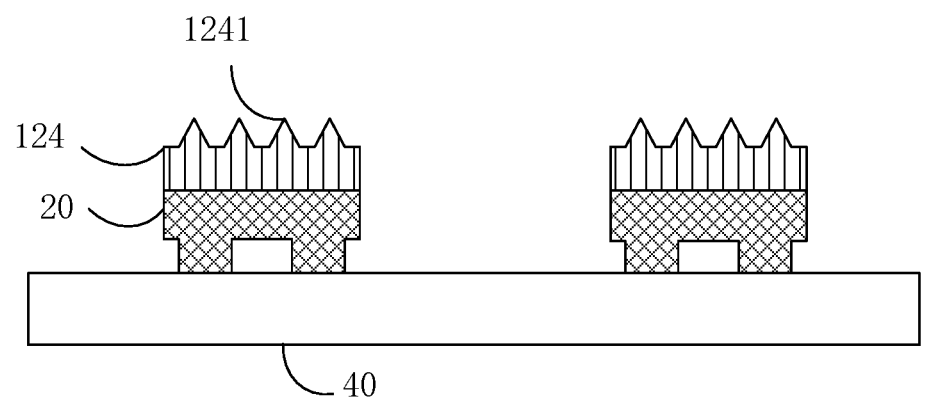
FIG. 19 schematically shows a fourth particular schematic processing diagram of the carrier plate shown in FIG. 15.

As shown in FIG. 19, in the process of the transferring of the light-emitting-diode chips 20 to a driving chip 40 by using the carrier plate shown in FIG. 15, under the irradiation of the dissociating light, the laser dissociation layer 123 can be gasified and dissociated, and the viscous-adhesive-material layer 124 can fall together with the light-emitting-diode chips 20. Because the viscous-adhesive-material layer 124 is provided with the first micro-feature 1241 on the side that is closer to the laser dissociation layer 123, the first micro-feature 1241 can be used to serve as a light extracting member, and it is not required to remove the viscous-adhesive-material layer 124 on the light-emitting-diode chips 20, which avoids the operation of removing residual adhesive from the light-emitting-diode chips 20, and further increases the efficiency of the mass transfer of the light-emitting-diode chips 20.

In conclusion, the carrier plate according to the embodiments of the present application can have at least the following advantages:

In the embodiments of the present application, by providing the dissociation regulating feature between the dissociable-adhesive layer and the transporting base plate, in the process of the mass transfer of the light-emitting-diode chips, the dissociation regulating feature can regulate the dissociation accuracy of the dissociable-adhesive layer. Accordingly, position deviation of the light-emitting-diode chips in the process of falling can be prevented, to increase the yield and the dissociation accuracy of the light-emitting-diode chips, which can increase the yield in the process of the mass transfer and the efficiency of the mass transfer of the light-emitting-diode chips.

An embodiment of the present application further provides a transferring device, wherein the transferring device may particularly comprise: a plurality of light-emitting-diode chips and the carrier plate stated above. The plurality of light-emitting-diode chips are connected to the dissociable-adhesive layer of the carrier plate, and the transferring device may be used to transfer the plurality of light-emitting-diode chips to a driving chip of a displaying device, to realize the mass transfer of the light-emitting-diode chips.

It should be noted that the structure of the carrier plate according to the embodiment of the present application is the same as the structure of the carrier plate according to the above-described embodiments, and is not discussed here further.

In the carrier plate according to the embodiments of the present application, by providing the dissociation regulating feature between the dissociable-adhesive layer and the transporting base plate, in the process of the mass transfer of the light-emitting-diode chips, the dissociation regulating feature can regulate the dissociation accuracy of the dissociable-adhesive layer. Accordingly, position deviation of the light-emitting-diode chips in the process of falling can be prevented, to increase the yield and the dissociation accuracy of the light-emitting-diode chips, which can increase the yield in the process of the mass transfer and the efficiency of the mass transfer of the light-emitting-diode chips.

Figure 20:
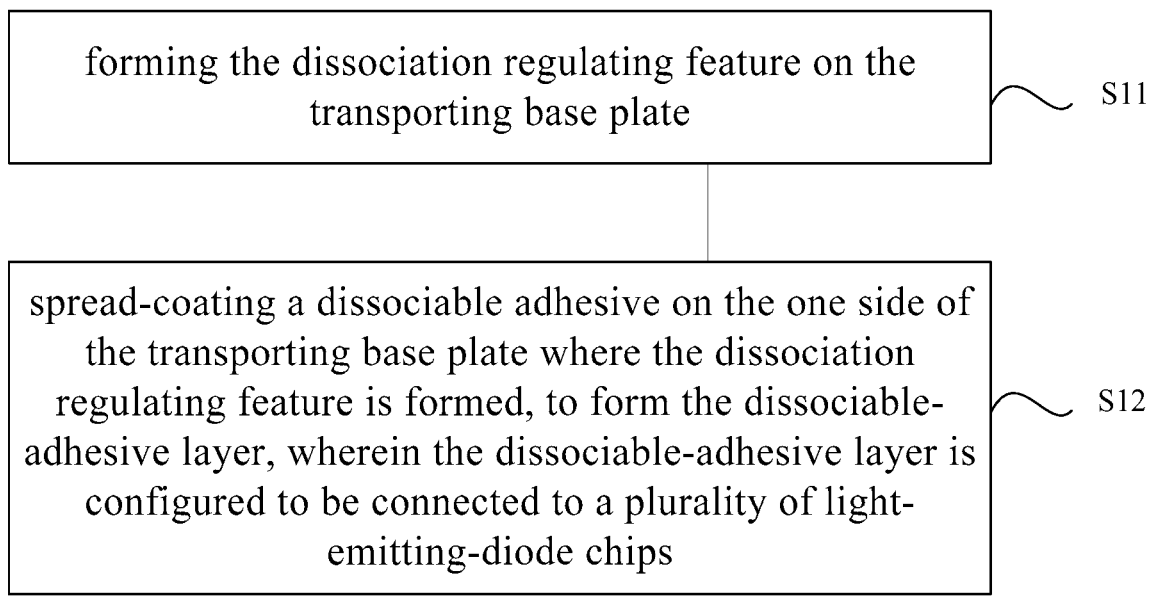
FIG. 20 schematically shows a flow chart of the steps of the method for processing a carrier plate according to an embodiment of the present application.

Referring to FIG. 20, a flow chart of the steps of the method for processing a carrier plate according to an embodiment of the present application is shown. The processing method may be used to process the carrier plate according to the above-described embodiments. The processing method may particularly comprise the following steps:

Step S11: forming the dissociation regulating feature on the transporting base plate.

In an embodiment of the present application, the dissociation regulating feature may be firstly formed on the transporting base plate 10, to form the dissociation regulating feature between the dissociable-adhesive layer 12 and the transporting base plate 10 facilitatly. In the process of the mass transfer of the light-emitting-diode chips 20, the dissociation regulating feature can regulate the dissociation accuracy of the dissociable-adhesive layer 12. That can prevent position deviation of the light-emitting-diode chips 20 in the process of falling, and increase the yield and the dissociation accuracy of the light-emitting-diode chips 20, thereby increasing the yield in the process of the mass transfer and the efficiency of the mass transfer of the light-emitting-diode chips 20.

In some alternative embodiments of the present application, the dissociation regulating feature may comprise a plurality of regulating micro-features, and each of the regulating micro-features corresponds to one of the light-emitting-diode chips 20. The orthographic projection of the regulating micro-feature on the transporting base plate 10 is a first projection, and the orthographic projection of the light-emitting-diode chip 20 on the transporting base plate 10 is a second projection. The first projection of each of the regulating micro-features and the second projection of the light-emitting-diode chip 20 corresponding are thereto at least partially overlapped, and the area of the first projection is less than or equal to the area of the second projection.

Particularly, the regulating micro-feature may be a pattern and a micro-feature, and may also be a grating, a microlens, a pre-provided feature and so on. The micro-feature can optimize the interface morphology of the dissociable-adhesive layer 12. Accordingly, the dissociable-adhesive layer 12 can automatically exhaust gas by the periphery in the process of dissociation. By providing a regulating micro-feature correspondingly to each of the light-emitting-diode chips 20, the problem of deviation of the light-emitting-diode chips 20 caused by unsmooth gas exhaustion can be effectively solved.

As an example, the regulating micro-feature may be provided at the center region of the light-emitting-diode chip 20, whereby the first projection and the center region of the second projection are overlapped. Alternatively, the regulating micro-feature may also be provided at the peripheral region of the light-emitting-diode chip 20, whereby the first projection and the peripheral region of the second projection are overlapped. Alternatively, the regulating micro-feature may also be provided at the entire outer-surface region of the entire light-emitting-diode chip 20, whereby the first projection and the second projection are completely overlapped. The particular position of the regulating micro-feature relative to the light-emitting-diode chip 20 is not limited in the present application.

Step S12: spread-coating a dissociable adhesive on the one side of the transporting base plate where the dissociation regulating feature is formed, to form the dissociable-adhesive layer, wherein the dissociable-adhesive layer is configured to be connected to a plurality of light-emitting-diode chips.

In an embodiment of the present application, the dissociable-adhesive layer 12 of the carrier plate may be configured to be connected to a plurality of light-emitting-diode chips 20, and the plurality of light-emitting-diode chips 20 may be distributed on the carrier plate in an array. The light-emitting-diode chips 20 may be light-emitting-diode chips that emit the same color or different colors, which is not limited in the embodiments of the present application.

Particularly, the dissociable-adhesive layer 12 may be a laser-dissociable adhesive, and by irradiating a laser to some area of the transporting base plate 10, the dissociable-adhesive layer 12 in the corresponding area can be dissociated, whereby the light-emitting-diode chips 20 in that area fall, and transfer to the driving substrate. Alternatively, the dissociable-adhesive layer 12 may also be a pyrolyzed adhesive, and, in this case, some area of the transporting base plate 10 may be heated to dissociate the corresponding area of the dissociable-adhesive layer 12, whereby the light-emitting-diode chips 20 in that area fall, and transfer to the driving substrate.

In the carrier plate according to the embodiments of the present application, by providing the dissociation regulating feature between the dissociable-adhesive layer and the transporting base plate, in the process of the mass transfer of the light-emitting-diode chips, the dissociation regulating feature can regulate the dissociation accuracy of the dissociable-adhesive layer. Accordingly, position deviation of the light-emitting-diode chips in the process of falling can be prevented, to increase the yield and the dissociation accuracy of the light-emitting-diode chips, whereby it can increase the yield in the process of the mass transfer and the efficiency of the mass transfer of the light-emitting-diode chips.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Some or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A carrier plate, wherein the carrier plate comprises: a transporting base plate, a dissociation regulating feature and a dissociable-adhesive layer that are sequentially arranged, wherein the dissociation regulating feature is configured to regulate a dissociation accuracy of the dissociable-adhesive layer, and the dissociable-adhesive layer is configured to be connected to a plurality of light-emitting-diode chips;

wherein the dissociation regulating feature comprises: an arc-shaped protrusion provided on one side of the dissociable-adhesive layer that is closer to the transporting base plate.

2. The carrier plate according to claim 1, wherein the dissociation regulating feature comprises a plurality of regulating micro-features, and each of the regulating micro-features corresponds to one of the light-emitting-diode chips;

an orthographic projection of each of the regulating micro-features on the transporting base plate is a first projection, and an orthographic projection of the light-emitting-diode chip corresponding thereto on the transporting base plate is a second projection; and the first projection of each of the regulating micro-features and the second projection of the light-emitting-diode chip corresponding thereto at least partially overlap, and an area of the first projection is less than or equal to an area of the second projection.

3. The carrier plate according to claim 1, wherein the transporting base plate is provided with a first arc-shaped slot at a position facing the arc-shaped protrusion, a shape of the first arc-shaped slot and a shape of the arc-shaped protrusion are matched, and the arc-shaped protrusion is embedded in the first arc-shaped slot.

4. The carrier plate according to claim 1, wherein the carrier plate further comprises: a medium layer, the medium layer is provided between the transporting base plate and the dissociable-adhesive layer, the medium layer is provided with a second arc-shaped slot at a position facing the arc-shaped protrusion, a shape of the second arc-shaped slot and a shape of the arc-shaped protrusion are matched, and the arc-shaped protrusion is embedded in the second arc-shaped slot.

5. The carrier plate according to claim 4, wherein a thickness of the medium layer is greater than a depth of the second arc-shaped slot.

6. The carrier plate according to claim 1, wherein a thickness of the dissociable-adhesive layer is greater than a depth of the arc-shaped protrusion.

7. A carrier plate, wherein the carrier plate comprises: a transporting base plate, a dissociation regulating feature and a dissociable-adhesive layer that are sequentially arranged, wherein the dissociation regulating feature is configured to regulate a dissociation accuracy of the dissociable-adhesive layer, and the dissociable-adhesive layer is configured to be connected to a plurality of light-emitting-diode chips;

wherein the dissociable-adhesive layer comprises: a laser dissociation layer and a viscous-adhesive-material layer, the laser dissociation layer is located on one side of the transporting base plate that is closer to the light-emitting-diode chips, and the viscous-adhesive-material layer is located between the laser dissociation layer and the light-emitting-diode chips; and the viscous-adhesive-material layer is provided with a first micro-feature on a side that is closer to the laser dissociation layer, the laser dissociation layer is provided with a second micro-feature on a side that is closer to the viscous-adhesive-material layer, a shape of the second micro-feature and a shape of the first micro-feature are complementary, and the second micro-feature and the first micro-feature are embedded into each other.

8. The carrier plate according to claim 7, wherein a thickness of the laser dissociation layer is 1-3 µm, and a thickness of the viscous-adhesive-material layer is 1-10 µm.

9. The carrier plate according to claim 7, wherein the first micro-feature is a nanometer micro-feature, and the first micro-feature is selected from at least one of a circular-cone-shaped micro-feature and a rhombic micro-feature.

10. A transferring device, wherein the transferring device comprises: a plurality of light-emitting-diode chips and the carrier plate according to claim 1; and the plurality of light-emitting-diode chips are connected to the dissociable-adhesive layer of the carrier plate.

* * * * *